United States Patent
Erlat et al.

(10) Patent No.: US 7,976,908 B2
(45) Date of Patent: Jul. 12, 2011

(54) HIGH THROUGHPUT PROCESSES AND SYSTEMS FOR BARRIER FILM DEPOSITION AND/OR ENCAPSULATION OF OPTOELECTRONIC DEVICES

(75) Inventors: Ahmet Gun Erlat, Clifton Park, NY (US); Anil Raj Duggal, Niskayuna, NY (US); Min Yan, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 55 days.

(21) Appl. No.: 12/122,326

(22) Filed: May 16, 2008

(65) Prior Publication Data

US 2009/0286010 A1 Nov. 19, 2009

(51) Int. Cl.
*C23C 16/513* (2006.01)
*B05D 5/12* (2006.01)

(52) U.S. Cl. ... 427/569; 427/575; 427/582; 118/723 MP

(58) Field of Classification Search .................. 427/569, 427/575, 582; 428/12, 412; 315/111.21
See application file for complete search history.

(56) References Cited

U.S. PATENT DOCUMENTS

| | | | |
|---|---|---|---|
| 4,474,659 A * | 10/1984 | Fazlin | 204/192.12 |
| 4,842,941 A | 6/1989 | Devins et al. | |
| 4,887,005 A * | 12/1989 | Rough et al. | 315/111.21 |
| 4,927,704 A | 5/1990 | Reed et al. | |
| 5,156,882 A | 10/1992 | Rzad et al. | |
| 5,260,134 A | 11/1993 | Hayashi et al. | |
| 7,015,640 B2 | 3/2006 | Schaepkens et al. | |
| 2005/0224935 A1 | 10/2005 | Schaepkens et al. | |
| 2007/0202640 A1* | 8/2007 | Al-Bayati et al. | 438/184 |
| 2007/0275181 A1* | 11/2007 | Carcia et al. | 427/582 |
| 2008/0138624 A1* | 6/2008 | Lewis et al. | 428/412 |
| 2008/0196664 A1* | 8/2008 | David et al. | 118/623 |

OTHER PUBLICATIONS

Lewis et al., "Thin-Film Permeation-Barrier Technology for Flexible Organic Light-Emitting Devices", IEEE Journal of Selected Topics in Quantum Electronics, vol. 10, No. 1, Jan./Feb. 2004, pp. 45-57.
Lungenschmied et al., "Flexible Encapsulation for Organic Solar Cells" Photonics for Solar Energy Systems, Proc. of SPIE vol. 6197, pp. 1-8.

* cited by examiner

*Primary Examiner* — Duy-Vu N Deo
*Assistant Examiner* — Mahmoud Dahimene
(74) *Attorney, Agent, or Firm* — Mary Louise Gioeni

(57) ABSTRACT

Processes for simultaneously encapsulating multiple optoelectronic devices and/or depositing a barrier film onto multiple substrates suitable for fabrication of optoelectronic devices thereon include the use of a plasma deposition apparatus having multiple pairs of opposing electrodes for deposition of reactants onto the substrate that is used to form the device or the complete device itself. The processes significantly reduce tact time relative to one at a time batch processing that is currently used for manufacturing optoelectronic devices.

6 Claims, 3 Drawing Sheets

US 7,976,908 B2

HIGH THROUGHPUT PROCESSES AND SYSTEMS FOR BARRIER FILM DEPOSITION AND/OR ENCAPSULATION OF OPTOELECTRONIC DEVICES

BACKGROUND

Organic light-emitting diodes, or OLEDs, are examples of solid-state optoelectronic devices that can have several layers of organic material and polymers. An OLED device commonly includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full-color flat emission displays.

Optoelectronic devices, especially OLEDs, are generally prone to degradation under ambient environment conditions. For example, a common problem with OLED displays is sensitivity to moisture. Specifically, water vapor in the presence of oxygen may cause undesired crystallization and formation of organic solids within the device; undesired reactions at the electrode-organic layer interfaces; corrosion of metals and the undesired migration of ionic species; and the like. The water related degradation often manifests itself as the growth of dark spots in the emissive areas of the OLED, which can lead to performance loss, operational instability, poor color and emission accuracies, and shortened operational life. Dark spot growth in quantity, size and location is usually based upon the time and extent of exposure to degrading conditions.

To minimize such degradation mechanisms, optoelectronic devices such as the organic light-emitting devices are typically encapsulated and hermetically sealed with barrier material. However, it is not easy to completely eliminate conditions that may degrade an electronic device. Encapsulation methods themselves may trap some residual moisture within the device. Furthermore, even in an encapsulated environment, it is difficult to prevent all degradation, which inevitably occurs over time.

Thin film encapsulation is advantageous over the use of glass or metal caps with epoxy sealants and desiccants because it is more cost effective with a simpler process. However, throughput is generally limited. Currently, the tact time (time required to complete a fully encapsulated OLED) for thin film encapsulation of opto-electronic devices is longer than what is required for a commercially viable process. To increase throughput, manufacturers tend to utilize multiple plasma deposition reactors, which is not cost effective and consumes a significant footprint.

Accordingly, there exists a need for improved methods for encapsulation of optoelectronic devices so as to improve tact time, throughput and productivity

BRIEF SUMMARY

The present disclosure is directed to high throughput processes and systems for forming barrier films on substrates and/or for encapsulating an optoelectronic device with the barrier film. In one embodiment, a high throughput process for fabricating barrier films comprises feeding and simultaneously depositing a barrier film onto multiple polymeric substrates and/or optoelectronic devices in a plasma deposition apparatus, wherein the apparatus comprises a single chamber housing multiple electrode pairs with each pair in electrical communication with an energy source, wherein each one of the multiple polymeric substrates or optoelectronic devices is situated between multiple electrode pairs; and simultaneously forming the barrier film on each one of the multiple polymeric substrates or the optoelectronic unit with the barrier film.

In another embodiment, a process for forming an encapsulated optoelectronic device comprises feeding multiple optoelectronic devices into a plasma deposition apparatus, wherein the apparatus comprises a chamber housing multiple electrode pairs with each pair in electrical communication with a separate energy source, wherein each one of the multiple optoelectronic devices is situated between a selected one of the multiple electrode pairs; introducing a reactant gas between each one of the multiple electrode pairs and forming a plasma of the reactant gas; and simultaneously encapsulating each one of the multiple optoelectronic devices by depositing a barrier film from the plasma.

A system for manufacturing optoelectronic devices comprises a plasma deposition apparatus comprises a plasma deposition apparatus comprising a single chamber housing multiple electrode pairs with each pair in electrical communication with a separate energy source; a gas supply for channeling a reactant gas between each one of the multiple electrode pairs; and a supply coupled to the plasma deposition apparatus configured to introduce multiple substrates and/or substrates including the optoelectronic device, the supply configured to insert one or more of the multiple substrates or substrates including the optoelectronic device between each one of the multiple electrode pairs.

The disclosure may be understood more readily by reference to the following detailed description of the various features of the disclosure and the examples included therein.

BRIEF DESCRIPTION OF THE DRAWINGS

The figures below, wherein like elements are numbered alike, are for illustrative purposes only.

DETAILED DESCRIPTION

The present disclosure is generally directed to processes for simultaneously encapsulating multiple optoelectronic devices and/or coating multiple substrates with a barrier film using a single chamber plasma deposition apparatus. In one embodiment, the plasma deposition apparatus includes multiple pairs of opposing electrodes for deposition of reactants that are used to encapsulate the optoelectronic device and/or coat a surface of the substrate itself. By way of example, a suitable plasma deposition apparatus is a parallel plate plasma enhanced chemical vapor deposition (PECVD) apparatus modified as generally described above. As will be discussed in greater detail below, multiple substrates and/or optoelectronic devices are disposed within a reaction chamber of the plasma apparatus such that each one of the substrates/devices is situated between an electrode pair and seated on one of the electrodes in the matching pair. In one embodiment, the number of substrates/devices fed into the apparatus generally conforms to the number of electrodes pairs. In other embodiments, multiple substrates and/or devices may be seated on one of the electrodes in electrode pair and processed accordingly. At least one gaseous reactant capable of forming a barrier layer on the substrate and/or device is passed between the electrodes. An electric field is generated between the electrode pairs to form plasma with the reactants. The gaseous reactants react in the plasma and on the coating surface to form the desired barrier layer.

In some embodiments, the optoelectronic devices can be formed on a barrier coated substrate such that the processing sequence includes forming a barrier film on one or more substrates in the single chamber plasma deposition apparatus, removing the barrier coated substrates for fabricating the device in a manner well known to those in the art, and encapsulating one or more of the devices with the barrier film in the plasma deposition apparatus. In other embodiments, the optoelectronic device can already be fabricated on a substrate, e.g., glass, metal foil or plastic/barrier and one or more of the optoelectronic devices can then be encapsulated in the single chamber plasma deposition apparatus.

Figure 1:
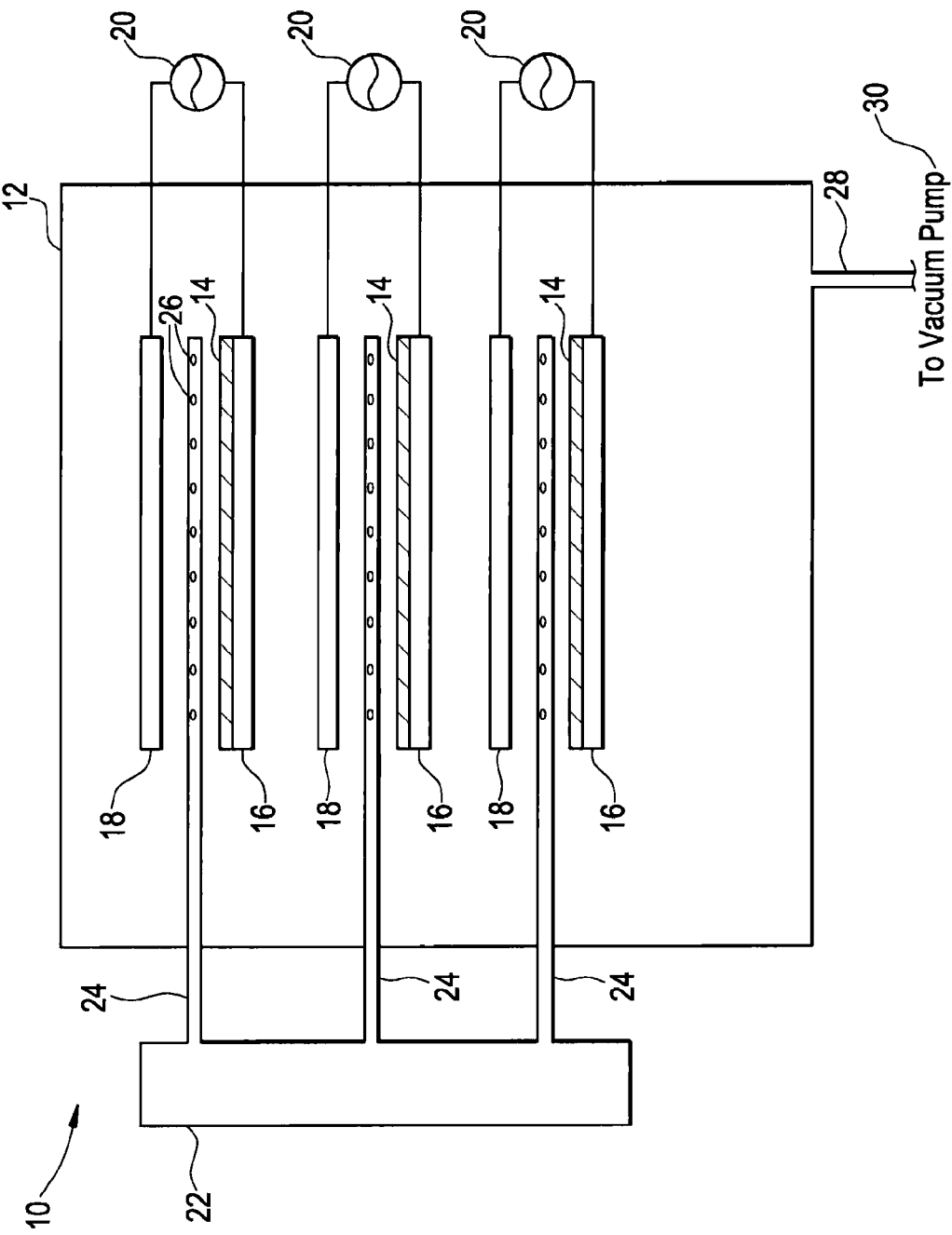
FIG. 1 is a cross sectional view of a single chamber parallel deposition PECVD chamber for encapsulation of an optoelectronic device in accordance with of the present disclosure.
Figure 2:
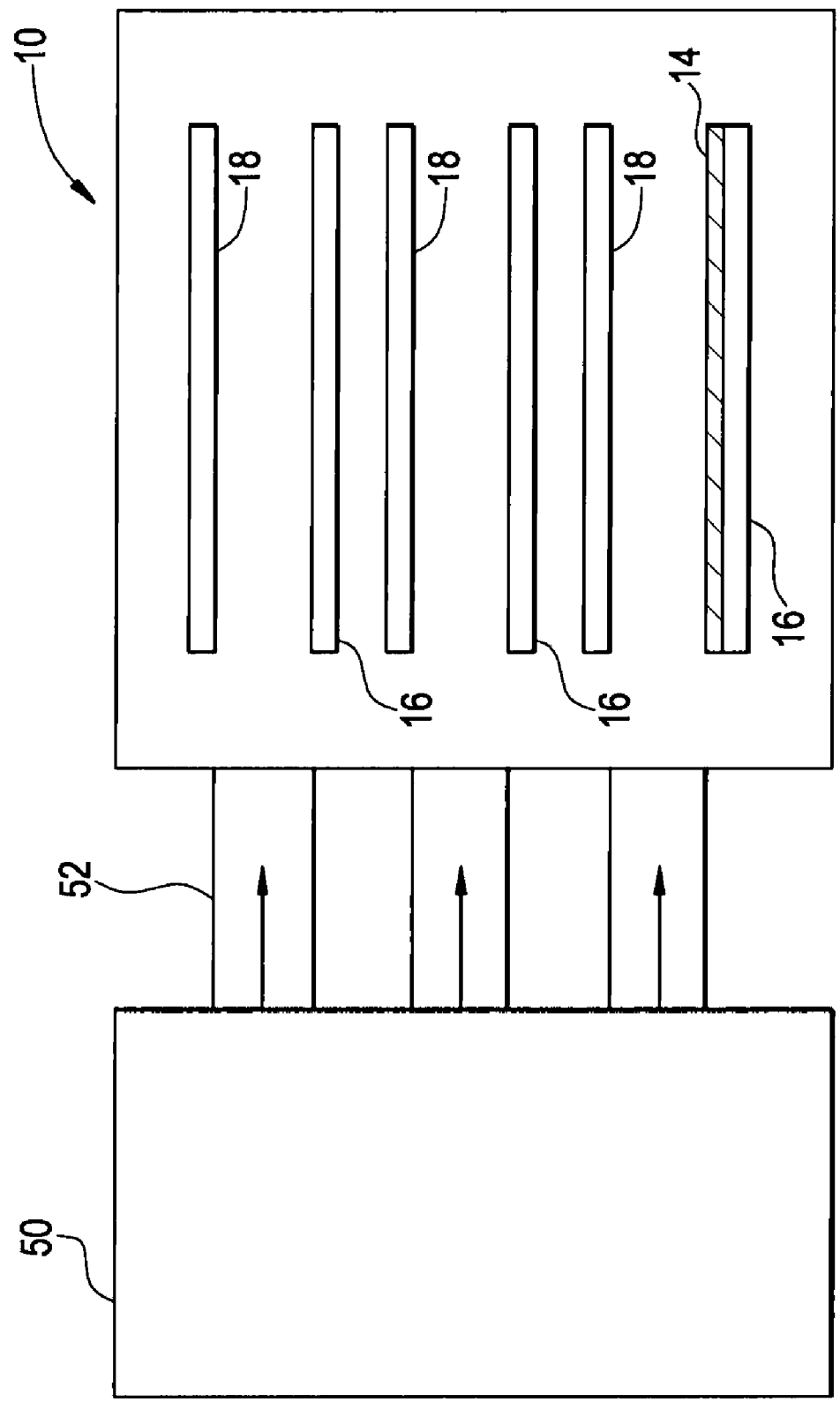
FIG. 2 is a cross sectional view of the single chamber parallel deposition PECVD chamber in operative communication with an optoelectronic device and/or substrate supply source.

Turning now to FIGS. 1 and 2, there are shown cross sectional views of a system that includes an exemplary plasma deposition apparatus 10 suitable for depositing a thin film onto multiple substrates and/or devices.

The plasma deposition apparatus 10 generally includes a reaction chamber 12 in which multiple substrates and/or optoelectronic devices 14 are disposed. Each one of the substrates and/or optoelectronic devices 14 is disposed between a pair of electrodes 16, 18, which are in electrical communication with a high energy source 20, e.g., a radiofrequency source, direct current, magnetic field, and the like. Optionally, multiple substrates and/or devices are disposed between a pair of electrodes. An electric field is generated between the electrodes 16, 18 under pre-selected frequency and power conditions to ionize the gas mix, thereby forming plasma. Methods of generating an electric field between the electrodes are well-known in the art and therefore do not require an exhaustive description here. For example, frequencies from 50 Hz to about 10 GHz, may be used. A particularly suitable electrical field-generating means for this process is the use of a high frequency power supply to initiate and sustain the plasma. In one embodiment, the operating frequency is 13.56 MHz. The particular frequency and power values utilized will generally depend in part on the particular deposition requirement for the coating material.

Each of the electrodes 16, 18 has a planar face parallel to the other electrode, wherein the orientation of the electrodes can be horizontal as shown or vertical depending on the design of the apparatus. In one embodiment, the electrodes are horizontally arranged within the chamber, i.e., an upper electrode 18 with a planar surface is facing a planar surface of a lower electrode 16. The spacing between the electrodes 16, 18 generally depends on the desired strength of the applied electric field, as well as the size of the substrate and/or optoelectronic device 14 being coated. Those skilled in the art of vapor deposition appreciate the interrelationship of these processing variables and are therefore able to make adjustments for a particular use without undue experimentation. In one embodiment, each substrate and/or optoelectronic device 14 is positioned on the surface of the lower electrode 16 which faces the upper electrode 18, such that the substrate surface to be coated and/or optoelectronic device 14 to be encapsulated is parallel to the facing surface of the upper electrode 18. Alternatively, multiple substrates and/or optoelectronic devices can be positioned on the surface of the lower electrode.

The film-forming materials that define the barrier coating are typically in a vapor gaseous form when they enter the plasma deposition apparatus. Suitable reactants can be vaporized from a liquid form prior to entry into the reactor chamber 12 or alternatively, may be in a gas phase. In the case of liquids, depending on the particular boiling point, the liquid may be heated to ambient temperature or higher in order to provide sufficient positive vapor pressure to flow through a channeling system such as that described below. Alternatively, a carrier gas such as helium can be blown through the liquid to obtain a diluted vapor mixture of desired composition. The gaseous (i.e., vapor) reactants react in the plasma and on the coating surface to form the desired barrier layer.

The channeling system includes a gas source 22 in fluid communication with the interior of the chamber 12 to provide the gaseous reactants. In one embodiment (as shown), the gas source 22 includes one or more conduits 24 in fluid communication therewith and extending between each electrode pair 16, 18 within the chamber. The conduits 24 may include a plurality of apertures 26 for uniformly introducing the reactants between the electrodes. Although the flow through the apertures is axial, an alternative embodiment is to provide a laminar flow of reactants across the substrate to be coated. In this embodiment, the conduits would be configured to provide a laminar flow between the electrodes. The chamber 12 further includes a conduit 28 connected to a vacuum pump 30 so as to provide a partial vacuum during operation. In one embodiment, the chamber 12 is evacuated prior to entry of the gaseous reactants. Suitable chamber pressures for the process generally range from about 50 millitorrs to about 10 torrs. Optionally, the substrate, the optoelectronic device and/or the reactor walls may be heated during plasma deposition.

As clearly shown in FIG. 2, a substrate and/or optoelectronic device supply 50 is coupled to the plasma deposition apparatus 10 such that multiple substrates and/or optoelectronic devices 14 may be fed into the single chamber apparatus. Various handlers and robotic interfaces suitable for transferring the devices into the plasma deposition apparatus are well known to those in the art. By way of example, a loadlock chamber 52 may be used as an intermediary to pass the substrates and/or devices into the plasma deposition apparatus.

As noted above, optoelectronic devices such as organic light-emitting materials and/or cathode materials in OLEDs are susceptible to attack by reactive species existing in the ambient environment, such as oxygen, water vapor, hydrogen sulfide, $SO_x$, $NO_x$, solvents, etc. Other optoelectronic devices that can benefit from the processes and systems discussed herein include, without limitation, organic light emitting diodes, organic electrochromic displays, organic photovoltaic devices and organic thin film transistors, and like organic devices. Depending on the particular configuration of the optoelectronic device, the barrier films can be deposited directly on the substrate or may be used to encapsulate the optoelectronic device. The composition of the barrier films are selected to provide substantial impermeability to reactive species such as water vapor and/or oxygen and are particularly useful to extend the life of these optoelectronic devices so as to render them more commercially viable. Varying the relative supply rates or changing the identities of the reacting species can result in a coating having a graded composition across its thickness as may be desired for some applications. Suitable graded compositions are disclosed in U.S. Pat. No. 7,015,640.

The basic OLED structure generally consists of two or more organic layers disposed between an anode and a cathode, herein defined as the OLED unit. A power source is attached to the anode and cathode. The device structure is completed with some form of encapsulation above the cathode. If the substrate is permeable, as in the case of most flexible polymeric materials, then an additional permeation barrier may be formed on the substrate surface. In the manufacture of glass based displays, encapsulation has been achieved by sealing the display in an inert atmosphere such as nitrogen and argon using a glass or metal lid secured by a bead of UV-cured epoxy resin. A getter, such as calcium oxide or barium oxide, is often disposed within an interior of the package to react with any byproducts of the resin cure process and any residual water within in the package or that occur by diffusing through the epoxy based seal over time.

Figure 3:
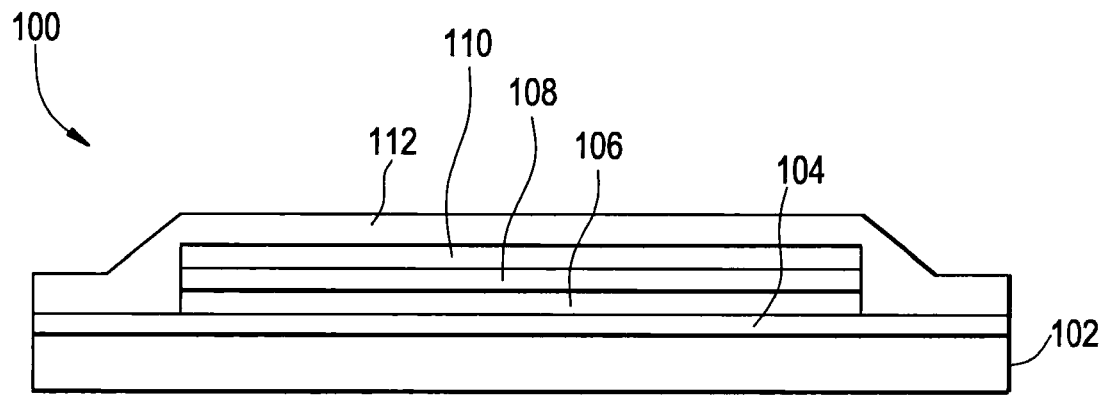
FIG. 3 is a cross sectional view of an OLED device encapsulated in accordance with an embodiment of the present disclosure.

Referring now to FIG. 3 and using OLEDs as an example, an encapsulated OLED device 100 comprises an OLED unit generally formed of an anode 106, a cathode 110 spaced from anode 106, and one or more organic light emitting layers 108 disposed between the anode and the cathode, all of which are disposed on a base substrate 102. In one embodiment, the base substrate 102 may include a barrier film 104 in the event that the substrate 102 is formed of a permeable material. Although the barrier film 104 is shown deposited on a top surface of the base substrate 102, it should be apparent that the barrier film could have been deposited onto the backside of the base substrate 102, or both the backside and the topside surfaces. In this embodiment, multiple substrates 102 may first be simultaneously processed in the plasma deposition apparatus to form the barrier film. Once the barrier film is formed on the multiple substrates, the substrates are removed and the OLED unit is fabricated onto each one of the substrates in a conventional manner. For example, the anode in an OLED unit is typically an indium-tin-oxide (ITO) and is conformally deposited using a sputtering process, evaporation, sputtering, chemical vapor deposition, or electrochemical means. The one or more organic layers 108 are then deposited using techniques such as ink jet printing, gravure, microgravure, by physical or chemical vapor deposition, spin coating, dip coating, spraying, printing, or casting, followed by polymerization, if necessary, or curing of the material, and the like. The cathode is then formed typically by thermal evaporation, e-beam evaporation, sputtering, and the like.

Once the OLED unit is formed on the base substrate 102, the unit can be encapsulated. In the embodiment shown in FIG. 3, a barrier film 112 can be deposited directly onto the OLED unit using the plasma deposition apparatus in the manner discussed above. For example, multiple substrates that include the OLED unit formed thereon are simultaneously processed in the plasma deposition apparatus 10. The OLED device may further include an additional hard coat layer, if desired, for surface smoothing. Optionally, a cluster type configuration can be used to fabricate the complete optoelectronic device, which could also include the plasma deposition apparatus as one of the stations (i.e., components) within the cluster tool configuration.

Figure 4:
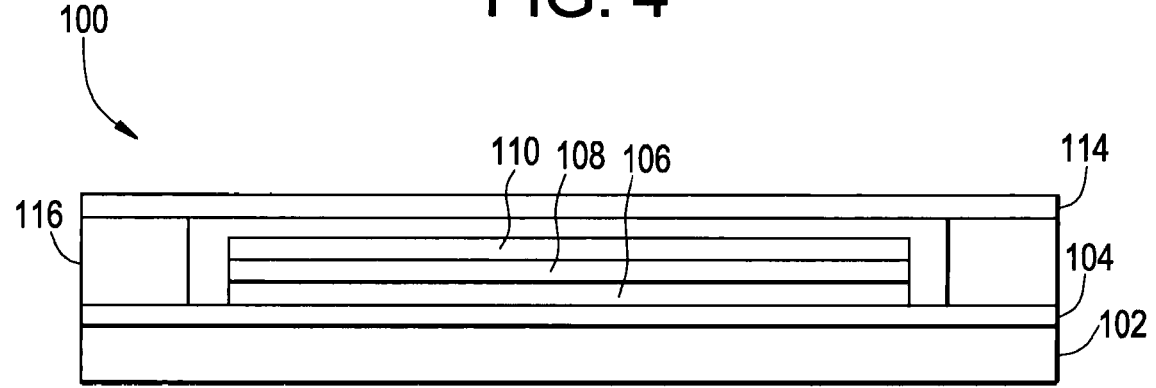
FIG. 4 is a cross sectional view of an OLED device encapsulated in accordance with an embodiment of the present disclosure.

Referring now to FIG. 4, the barrier film 104 is deposited onto multiple base substrates 102 in the single chamber plasma deposition apparatus. The base substrates 102 are then removed from the single chamber plasma deposition apparatus and the OLED unit is formed thereon, which includes the anode 106, the cathode 106 and the organic light emitting layer 108 there between. A lid 114 can be coupled to the base substrate 102 by means of a sealant 116, typically a UV cured epoxy. To provide further hermeticity, a dessicant or getter material (not shown) may be disposed within the pockets created upon coupling the lid substrate 114 to the base substrate 102. In this embodiment, the presence of the barrier film 104 prevents moisture and/or oxygen from permeating through the base substrate 102.

It should be understood that the relative locations of the anode and cathode may be reversed with respect to the substrate 102 depending on the configuration. Also, the substrate 102 may further include electrical connections, mounting components for attachment to a surface, or the like.

The barrier film, i.e., coating 104 prevents moisture and/or oxygen diffusion through the substrate. The barrier coating may be disposed at a thickness in the range of approximately 10 nm to about 10,000 nm, and preferably in the range of approximately 10 nm to about 1,000 nm. Depending on the optoelectronic device configuration, it is generally desirable to choose a coating thickness that does not impede the transmission of light through the substrate, such as a barrier coating that causes a reduction in light transmission of less than about 20%, and preferably less than about 5%. It is also desirable to choose a coating material and thickness that does not significantly reduce the substrate's flexibility, and whose properties do not significantly degrade with bending.

Suitable barrier coating compositions include organic, inorganic, or ceramic materials. The materials are reaction or recombination products of reacting plasma species and are deposited onto the substrate surface and/or as an encapsulant layer. Suitable organic coating materials typically comprise carbon, hydrogen, oxygen, and optionally other minor elements, such as sulfur, nitrogen, silicon, etc., depending on the types of reactants. Suitable reactants that result in organic compositions in the deposited coating are straight or branched alkanes, alkenes, alkynes, alcohols, aldehydes, ethers, alkylene oxides, aromatics, etc., having up to 15 carbon atoms. Suitable inorganic and ceramic coating materials typically comprise oxide; nitride; carbide; boride; or combinations thereof of elements of Groups IIA, IIIA, IVA, VA, VIA, VIIA, IB, and IIB; metals of Groups IIIB, IVB, and VB; and rare-earth metals. For example, silicon carbide can be deposited onto a substrate by recombination of plasmas generated from silane ($SiH_4$) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetraethoxysilane (TEOS), hexamethyldisiloxane (HMDSO), hexamethyldisilazane (HMDSN), or octamethylcyclotetrasiloxane (D4). Silicon nitride can be deposited from plasmas generated from silane and ammonia. Aluminum oxycarbonitride can be deposited from a plasma generated from a mixture of aluminum tartrate and ammonia. Other combinations of reactants may be chosen to obtain a desired coating composition. The choice of the particular reactants is well within the skills of the artisans. A graded composition of the coating can be obtained by changing the compositions of the reactants fed into the reactor chamber during the deposition of reaction products to form the coating.

Further, the barrier coating may comprise hybrid organic/inorganic materials or multilayer organic/inorganic materials. The organic materials may comprise acrylates, epoxies, epoxyamines, xylenes, siloxanes, silicones, etc. The choice of the particular reactants can be appreciated by those skilled in the art. Most metals may also be suitable for the barrier coating in applications where transparency of the flexible substrate is not required.

The one or more organic light emitting layers 108 of the OLED device generally include a luminescent or fluorescent material where electroluminescence is produced as a result of electron-hole pair recombination in this region and is configured to emit light, wherein the particular spectrum is not intended to be limited and will generally depend on the intended application. The light-emitting layer can be comprised of a single material or multiple materials. For example, the light emitting layer may include a host material doped with a guest compound or compounds where light emission comes primarily from the dopant and can be of any color. The host materials in the light-emitting layer can be an electron-transporting material, a hole-transporting material, or another material or combination of materials that support hole-electron recombination. Likewise, to generate the desired spectrum, the light emitting layer may include one or more emitters. For example, if white light emission is desired, the light emitting layer 108 may include first and second emitters that emit complementary, or nearly complementary colors. The combination of light emission between the two complementary colors can be selected to cover most of the visible spectrum in order to produce useful white light. For example, the first light emitter can emit yellow and the second light emitter can emit blue. Other combinations such as red and cyan are possible. Emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; 6,020,078; and 6,534,199.

Common materials useful in this disclosure for the anode 106 are indium-tin oxide as described above, and other suitable metal oxides including, but not limited to, tin oxide, aluminum- or indium-doped zinc oxide, magnesium-indium oxide, and nickel-tungsten oxide. In addition to these metal oxides, metal nitrides such as gallium nitride, metal selenides such as zinc selenide, and metal sulfides such as zinc sulfide, can be used as an anode material. In addition, ultra-thin metal films can be used by themselves or in combination of one of the previous layers to decrease the sheet resistance. Anode materials can be patterned using well-known photolithographic processes.

Cathode 110 is spaced apart from anode 106. For applications where the cathode materials should be transparent or substantially transparent to the emission of interest, metals, if used, should be thin or one should use transparent conductive oxides, or include these materials. When light emission is through the anode 106, the cathode material 110 can be comprised of nearly any conductive material. When needed, patterning can be achieved through many well known methods including, but not limited to, through-mask deposition, integral shadow masking, laser ablation, and selective chemical vapor deposition. The cathode can be deposited by evaporation, sputtering, or chemical vapor deposition. Desirable materials have effective film-forming properties to ensure effective contact with the underlying organic layer, promote electron injection at low voltage, and have effective stability. Useful cathode materials often contain a low work function metal (<3.0 eV) or metal alloy. Another suitable class of cathode materials includes bilayers comprised of a thin layer of a low work function metal or metal salt capped with a thicker layer of conductive metal.

The base substrate 102 can be an organic solid, an inorganic solid, or include organic and inorganic solids. Likewise, the substrate can be rigid or flexible and can be processed as separate individual pieces, such as sheets or wafers, or as a continuous roll, i.e., roll to roll. Typical substrate materials include glass, plastic, metal, ceramic, semiconductor, metal oxide, semiconductor oxide, semiconductor nitride, or combinations thereof. Substrates can be a homogeneous mixture of materials, a composite of materials, or multiple layers of materials. The substrate can either be light transmissive or opaque, depending on the intended direction of light emission. The light transmissive property is desirable for viewing the electroluminescent emission through the substrate. Transparent glass or plastic is commonly employed in such cases. For applications where the emission is viewed through the top electrode, the transmissive characteristic of the bottom support is immaterial. Substrates for use in this case include, but are not limited to, glass, plastic, metal foils, semiconductor materials, ceramics, and circuit board materials, e.g., FR4, or any others commonly used in the formation of OLED devices.

The materials that define the substrate 102 that benefit from having the barrier coating thereon are organic polymeric materials; such as, but not limited to, polyethyleneterephthalate ("PET"); polyacrylates; polycarbonate; silicone; epoxy resins; silicone-functionalized epoxy resins; polyester such as Mylar (made by E. I. du Pont de Nemours & Co.); polyimide such as Kapton H or Kapton E (made by du Pont), Apical AV (made by Kanegafugi Chemical Industry Company), Upilex (made by UBE Industries, Ltd.); polyethersulfones ("PES," made by Sumitomo); polyetherimide such as Ultem (made by General Electric Company); and polyethylenenaphthalene ("PEN"). The substrate can be selected to be relatively rigid or may be flexible depending on the particular application.

In another embodiment, subsets of layers necessary or desired for the fabrication of an OLED are formed in separate assemblies, and the assemblies are laminated or attached together to produce a working device. For example, a first substrate having the barrier coating, an assembly of an organic EL member, and a second substrate having a second barrier coating are laminated together to provide a light source having improved resistance to attack by chemical species in the environment. The first and second substrates can be processed in the single chamber plasma deposition apparatus to form the barrier coating and provide high throughput.

Advantageously, simultaneously depositing the barrier film onto multiple optoelectronics devices for encapsulation and/or substrates in a single reaction chamber greatly improves throughput, thereby lowering costs for manufacturing the devices. In addition, the processes and systems provide reduced capital costs for production type encapsulation by utilizing a single vacuum chamber with a single vacuum pump and power accessories. This also simplifies integration with an OLED production line and as such can be one station of a cluster tool or critical station(s) in a roll-to-roll OLED fabrication facility.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A process for forming an encapsulated optoelectronic device, the process comprising:

feeding multiple optoelectronic devices into a plasma deposition apparatus, wherein the apparatus comprises a chamber housing multiple electrode pairs with each pair in electrical communication with a separate energy source, wherein each one of the multiple optoelectronic devices is situated between a selected one of the multiple electrode pairs;

introducing a reactant gas via a plurality of conduits, wherein each conduit is disposed between a separate electrode pair, and forming a plasma of the reactant gas; and simultaneously encapsulating each one of the multiple optoelectronic devices by depositing a barrier film from the plasma.

2. The process of claim 1, wherein simultaneously encapsulating each one of the optoelectronic devices comprises introducing a laminar flow of reactant gas between each one of the multiple electrode pairs.

3. The process of claim 1, wherein simultaneously encapsulating each one of the multiple optoelectronic devices comprises introducing an axial flow of reactant gas between each one of the multiple electrode pairs.

4. The process of claim 1, wherein each one of the multiple optoelectronic devices is disposed on a selected one of a polymeric substrate, a polymeric substrate with the barrier film disposed on at least one surface, a glass substrate, or a metal substrate.

5. The process of claim 1, wherein the multiple optoelectronic devices comprise an organic light emitting diode, an electrochromic display, an organic photovoltaic device, or an organic thin film transistor.

6. The process of claim 1, wherein the chamber comprises a single vacuum pump in fluid communication with the chamber.

* * * * *